United States Patent [19]

Millman

[11] Patent Number: 5,128,555
[45] Date of Patent: Jul. 7, 1992

[54] PULSED CMOS LOGIC CIRCUIT HAVING SELECTABLE RISE AND FALL TIMES

[75] Inventor: Steven D. Millman, Mesa, Ariz.

[73] Assignee: Motorola, Inc., Schaumburg, Ill.

[21] Appl. No.: 800,734

[22] Filed: Dec. 3, 1991

Related U.S. Application Data

[63] Continuation of Ser. No. 670,656, Mar. 18, 1991, abandoned.

[51] Int. Cl.$^5$ .................. H03K 17/16; H03K 5/12
[52] U.S. Cl. .................. 307/443; 307/451; 307/263; 307/592; 307/606
[58] Field of Search ........ 307/443, 448, 451, 480–481, 307/592, 263, 606, 270, 601, 605

[56] References Cited

U.S. PATENT DOCUMENTS

| | | | |
|---|---|---|---|
| 4,728,822 | 3/1988 | Kusaka et al. | 307/451 |
| 4,758,743 | 1/1988 | Dehganpour et al. | 307/270 |
| 4,880,997 | 11/1989 | Steele | 307/263 |
| 4,991,140 | 2/1991 | Wang et al. | 307/481 |
| 5,047,673 | 9/1991 | Kaneko | 307/443 |

Primary Examiner—Stanley D. Miller
Assistant Examiner—Margaret Rose Wambach
Attorney, Agent, or Firm—Robert D. Atkins

[57] ABSTRACT

A CMOS logic circuit uses a boost transistor responsive to a pulse signal to rapidly charge and/or discharge the output node during predetermined transitions of the input signal and provide a selectable slew rate for one edge of the output signal. A pulse generator circuit provides the pulse signal of predetermined width at a first transition of the input signal and disables the pulse signal and boost transistor before the following transition to avoid adversely effecting the opposite edge of the output signal. The width of the pulse signal and the size of the boost transistor determines the slew rate of the output signal for the edge under control. Many types of logic circuits such as inverters, NAND gates and NOR gates may utilize dual boost transistors and pulse generator circuits for separate control over both output edge rates without adversely affecting the opposite edge.

14 Claims, 3 Drawing Sheets

PULSED CMOS LOGIC CIRCUIT HAVING SELECTABLE RISE AND FALL TIMES

This application is a continuation of prior application Ser. No. 07/670,656, now abandoned, filed Mar. 18, 1991.

FIELD OF THE INVENTION

This invention relates in general to logic circuits and, more particular, to a CMOS logic circuit having selectable rise and fall times by a pulsed boost current during predetermined transitions of the input signal.

BACKGROUND OF THE INVENTION

A primary goal in many logic designs is to minimize, or at least control, the timing skew introduced by varying propagation delays through the logic circuits. Sometimes it is necessary to add skew while other times it is desirable to reduce skew to achieve balanced rise and fall times as per the application. A basic inverter circuit may comprise, for example, a P-channel transistor and an N-channel transistor serially coupled between first and second power supply conductors and responsive to a common input signal for providing an inverted output signal at the common drains thereof. It is well understood in the art that P-channel transistors are inherently weaker (provide less drive) given the same geometry as an N-channel device. A common practice is to make the P-channel transistor say 2.5 times the area of the N-channel transistor to provide approximately equal drive levels for the output signal. However, if the input signal is already skewed with unequal rise and fall times, equal drive levels of the P-channel and N-channel transistors will only serve to propagate the existing timing skew.

Conventional techniques teach adjusting the sizes of the P-channel and N-channel transistors to compensate for the anticipated timing skew of the input signal and achieve the desired rise and fall times of the output signal. For example, if the rising edge of the output signal is too slow relative to the falling edge of the same, the respective sizes of the P-channel and N-channel devices may be increased from a ratio of 250/100 microns to 300/100 microns. The larger P-channel transistor pulls the output node toward the positive power supply conductor more rapidly and decreases the rise time (increase positive slew rate) of the output signal. Furthermore, increasing the size of the P-channel transistor increases the threshold voltage of the inverter circuit causing it to switch at a higher level of the input signal. Another option is to leave the P-channel transistor alone and decrease the size of the N-channel transistor to a ratio of 250/70 microns. This option also increases the threshold level of the inverter circuit. Unfortunately, by decreasing the size of the N-channel transistor one has also reduced the pull-down drive of the inverter circuit.

The aforedescribed compensation technique of manipulating P-channel and N-channel transistor sizes has a number of drawbacks. One of the drawbacks of increasing the size of the P-channel transistor, or decreasing the size of the N-channel transistor, to achieve faster rise times for the output signal is the associated increase in the fall time (slower zero-going slew rate) of the output signal. Increasing the size of the P-channel transistor alone has the effect of increasing the threshold voltage and turning the N-channel device on at a higher level of the input signal which increases the fall time of the output signal. Alternately, using a smaller N-channel transistor provides less drive strength to discharge the output node and pull the output signal low which also increases the fall time of the output signal. Hence, manipulating the sizes of the P-channel and N-channel transistors may speed up one edge, but not without adversely effecting the opposite edge.

The output loading is also a concern when attempting to customize transistor sizes and compensate for timing skew. Since decreasing the size of the N-channel device inherently provides less drive to the output load and increases the fall time, there is effectively a limit to how small the N-channel transistor can be made and still drive the output load. On the other hand, increasing the size of the P-channel transistor increases its gate capacitance and the input loading as seen by the external circuitry driving the inverter. Thus, whatever approach one chooses for adjusting timing skew there is a penalty adversely affecting the slew rate of the opposite edge or the input and output loading.

Another concern with adjusting P-channel and N-channel transistors is the limitation in build-up ratios. For example, in a string of serially coupled inverters it may be necessary to increase the size of each subsequent transistor inverter stage over the previous transistor inverter stage through a build-up ratio to achieve some ultimate drive capability. Practical limitations on the output drive of any conventional single inverter stage allows transistor build-up ratios of only two or three times between adjacent inverter stages without overloading the previous stage and sacrificing operating speed. Yet, space limitations in the application may not permit a long string of inverter stages to achieve the ultimate drive capability. Therefore, one must compromise between higher build-up ratios and lower operating speed.

Hence, what is needed is an improved CMOS logic circuit having independently selectable rise and fall times without adversely affecting the opposite edge or the input and output loading thereof. Furthermore, it is desirable to achieve higher build-up ratios without sacrificing operating speed.

SUMMARY OF THE INVENTION

Briefly stated, the invention comprises a circuit having an input for receiving an input signal and having an output for providing an output signal comprising a logic circuit responsive to the input signal for providing a first current through the output of the circuit and further responsive to a pulse signal for providing a boost current through the output of the circuit during a first transition of the input signal. The boost current drives the transition of the output signal while the first current maintains the resultant logic state of the output signal. A circuit is responsive to the input signal for generating the pulse signal during the first transition of the input signal.

In another aspect, the present invention is a method of selecting the rate of transition of an output signal of a logic circuit comprising the steps of enabling a minimal current through the output of the logic circuit in response to a first transition of the input signal applied to the logic circuit, and enabling a boost current through the output of the logic circuit during the first transition of the input signal. The boost current is disabled after a predetermined period of time and allowing the minimal current to maintain the state of the output signal of the logic circuit.

Thus, one advantage of the present invention is the technique of providing a boost current to the output circuit for a period of time during predetermined transitions of the input signal for controlling its transition rate and then removing the boost drive signal during the steady state operation and subsequent opposite edge to avoid adversely affecting the opposite edge.

DETAILED DESCRIPTION OF THE PREFERRED EMBODIMENT

Figure 1:
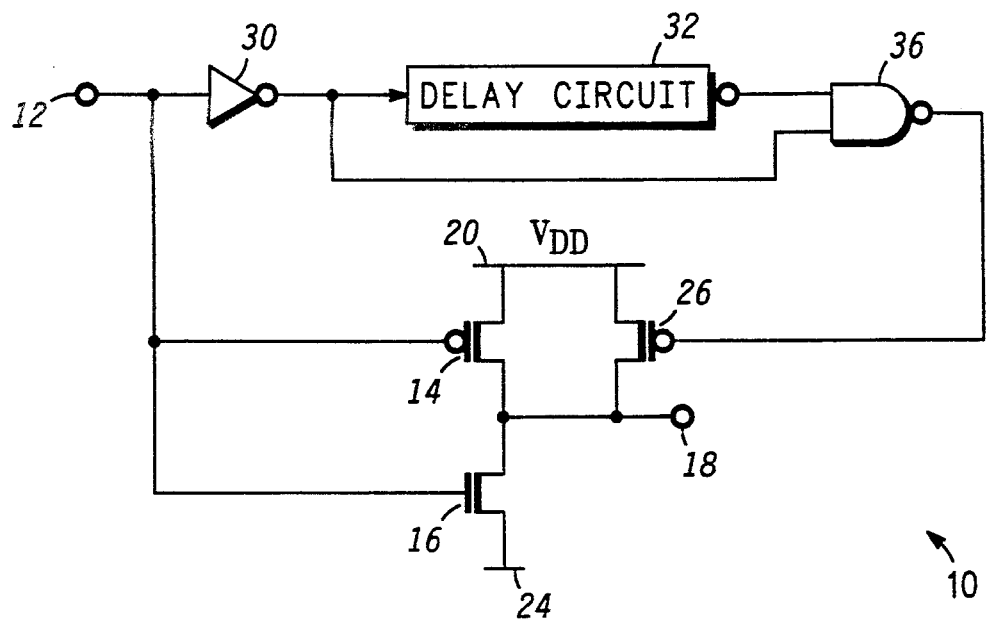
FIG. 1 is a schematic diagram illustrating an inverter logic circuit and pulse generator for providing a selectable rise time.

Referring to FIG. 1, there is shown inverter circuit 10 of the present invention suitable for manufacturing in integrated circuit form using conventional integrated circuit processes. A logic signal is applied at terminal 12 at the gates of transistors 14 and 16 which are coupled as an inverter for providing an output signal at the common drains thereof at terminal 18 inverted with respect to the input signal. The source of transistor 14 is coupled to power supply conductor 20 typically operating at a positive potential such as $V_{DD}$, and the source of transistor 16 is coupled to power supply conductor 24 operating at ground potential. A boost transistor 26 includes a source coupled to power supply conductor 20 and a drain coupled to terminal 18. Transistor 26 is sized much larger than transistor 14, say 250 microns for transistor 26, 10 microns for transistor 14 and 100 microns for transistor 16, for providing the majority of the output drive necessary to charge terminal 18 and pull the output signal toward $V_{DD}$ when the logic signal applied at terminal 12 transitions to logic zero. The gate of transistor 26 is responsive to a pulse signal from a pulse generator circuit including inverter 30 coupled between terminal 12 and the input of delay circuit 32. The outputs of inverter 30 and delay circuit 32 are coupled to the first and second inputs of NAND gate 36, respectively, while the output of the latter provides the pulse signal to the gate of boost transistor 26 during the falling edge (logic one to logic zero transition) of the input signal. Delay circuit 32 comprises an odd number of serially coupled inverters, three in the present example, for delaying the input signal and providing a selectable pulse width at the output of NAND gate 36 equal to the delay through the odd number of inverters.

First consider the falling edge transition of the input signal from a logic one to a logic zero. The initial logic one at terminal 12 is inverted once by inverter 30 and an odd number of times through delay circuit 32 resulting in the same logic one at the second input of NAND gate 36. The logic zero at the output of inverter 30 in combination with the logic one from delay circuit 32 produces a logic one at the output of NAND gate 36 thereby disabling boost transistor 26. Thus, inverter circuit 10 starts the zero-going transition of the input signal with boost transistor 26 off. As the input signal falls through the threshold of inverter 30, the logic one produced at the output thereof in combination with the logic one still present at the output of delay circuit 32 generates a logic zero at the output of NAND gate 36 and turns on boost transistor 26. The propagation path through inverter 30 and NAND gate 36 is relatively fast. Since boost transistor 26 is a much larger device than transistor 14, terminal 18 is pulled high toward $V_{DD}$ very rapidly. The logic one at the output of inverter 30 propagates through the three inverter delays of delay circuit 32, producing a logic zero at the second input of NAND gate 36 and correspondingly a logic one at the output of the same to turn off boost transistor 26. The actual positive slew rate of the output signal is determined by a combination of the width of the pulse signal and the size of boost transistor 26.

Thus, transistor 26 remains conductive for a period of time equal to the delay through delay circuit 32 for providing the boost drive to charge the capacitive load on terminal 18 toward $V_{DD}$ and achieve the desired rise time of the output signal. The rising edge of the output signal is selectable by adding more (or less) inverter circuits to delay circuit 32 provided the total number remains odd. The sizes of the inverter circuits of delay circuit 32 may also be adjusted for providing additional control of the overall delay. However, it is important that the total delay through delay circuit 32 is less than the steady state duration of the logic zero at terminal 12; otherwise, boost transistor 26 may still be conducting when the next logic one arrives at terminal 12 to turn on transistor 16. Typically, the delay through delay circuit 32 is only as long as the rise time of the output signal. The pulse generator circuit (30-36) is disclosed by way of example. Many other pulse generator circuits are known to have selectable low pulse widths, activated during one of the edge of the input signal and disabled during the opposite edge of the input signal.

The logic zero at terminal 12 also energizes transistor 14 although its effects during the transition of the output signal are negligible compared to boost transistor 26. Once the logic one is established at terminal 18 and boost transistor 26 is turned off, transistor 14 need only maintain the logic one at terminal 18 by the restoring any leakage therefrom. Thus, transistor 14 may be a small device. When the input signal at terminal 12 returns to a logic one, the logic zero at the output of delay circuit 32 maintains the logic one at the output of NAND gate 36 until a logic zero appears at the output of inverter 30 thereby keeping boost transistor 26 nonconductive during the rising edge of the input signal. Accordingly, transistor 16 need only contend with the relative small transistor 14 during the falling edge of the output signal and therefore may spend most of its energy discharging the capacitive load on terminal 18.

Hence, one of the advantages of the present invention is the use of boost transistor 26 responsive to a pulse signal generated during the falling edge of the input signal to rapidly charge the capacitive load on terminal 18 toward $V_{DD}$. The rising edge of the output signal is selectable by adjusting the width of the pulse and the relative size of boost transistor 26. Boost transistor 26 is disabled during the low period of the input signal and following rising edge. The associated fall time of the output signal is enhanced because transistor 16 works against a relatively small transistor 14 during the rising edge of the input signal resulting in a lower threshold voltage for inverter circuit 10.

Figure 2:
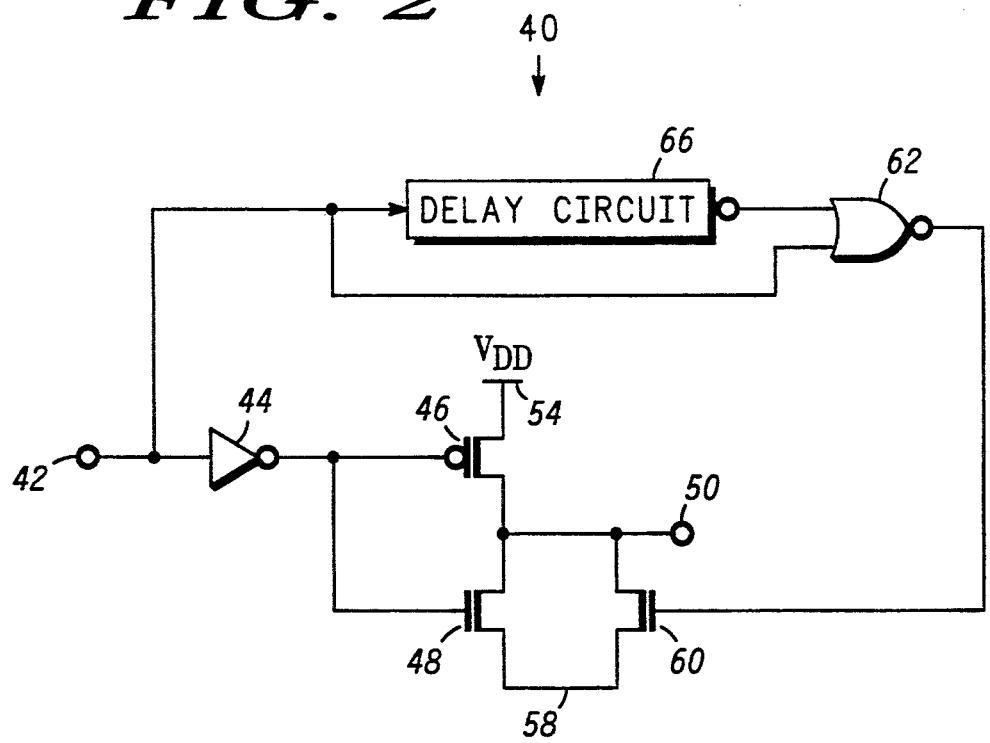
FIGS. 2 is a schematic diagram illustrating an inverter logic circuit and pulse generator for providing a selectable fall time.

Turning to FIG. 2, there is shown inverter circuit 40 and a pulse generator circuit for selecting the slew rate of the falling edge of the output signal. A logic signal is applied at terminal 42 through inverter 44 to the gates of transistors 46 and 48 which form an inverter for providing an output signal at terminal 50. The source of transistor 46 is coupled to power supply conductor 54 operating at $V_{DD}$, while the source of transistor 48 is coupled to power supply conductor 58 operating at ground potential. Boost transistor 60 includes a drain coupled to terminal 50 and a source coupled to power supply conductor 58. The signal from terminal 42 is also applied at the first input of NOR gate 62 and through delay circuit 66 to the second input of NOR gate 62, while the output of the latter is coupled to the gate of boost transistor 60. The relative sizes of transistors 46, 48 and 60 are 100, 10 and 250 microns, respectively.

A logic one at terminal 42 produces an initial logic zero at the output of inverter 44 which is the actual input of inverting transistors 46 and 48. The initial logic zero at the gates of transistors 46 and 48 allows the former to conduct and maintain terminal 50 at a logic one. Inverter 44 is required to be in the main conduction path of the input signal for proper operation and may be used to partially, or completely, mask the effect of propagation delay through NOR gate 62. The logic one at the first input of NOR gate 62 produces a logic zero at the output thereof and disables boost transistor 60. The initial logic one at terminal 42 is also inverted an odd number of times through delay circuit 66 producing a logic zero at the second input of NOR gate 62. Thus, inverter circuit 40 starts the zero-going transition of the input signal with boost transistor 60 off. As the signal at terminal 42 falls through the threshold of inverter 44, the logic one produced at the output thereof turns on transistor 48. The logic zero at the first input of NOR gate 62 in combination with the logic zero still present at the output of delay circuit 66 develops a logic one at the gate of boost transistor 60 turning it on. Since transistor 60 is a much larger device than transistor 48, terminal 50 is pulled low toward power supply conductor 58 very rapidly. The logic zero at terminal 42 propagates through the three inverter delays of delay circuit 66 producing a logic one at the second input of NOR gate 66 and correspondingly a logic zero at the output of the same to turn off boost transistor 60. The actual negative slew rate of the output signal is determined by a combination of the width of the pulse signal and the size of boost transistor 66.

Thus, transistor 60 remains conductive for a period of time equal to the delay through delay circuit 66 for providing the boost drive to discharge the capacitive load on terminal 50 toward ground potential and achieve the desired fall time of the output signal. The falling edge of the output signal is selectable by adding more (or less) inverter circuits to delay circuit 66 provided the total number remains odd. The sizes of the inverter circuits of delay circuit 66 may also be adjusted for providing additional control of the overall delay. However, it is important that the total delay through delay circuit 66 is less than the steady state duration of the logic one at gates of transistors 46 and 48; otherwise, boost transistor 60 may still be conducting when the next logic one arrives at terminal 42 to turn on transistor 46. Typically, the delay through delay circuit 66 is only as long as the fall time of the output signal. The pulse generator circuit (62-66) is disclosed by way of example. Many other pulse generator circuits are known to have selectable high pulse widths, activated during one of the edge of the input signal and disabled during the opposite edge of the input signal.

The logic zero at terminal 42 also energizes transistor 48 although its effects during the zero-going transition of the output signal are negligible compared to boost transistor 60. Once the logic zero is established at terminal 50 and boost transistor 60 is turned off, transistor 48 need only maintain the logic zero at terminal 50 by the restoring any leakage therefrom. Thus, transistor 48 may be a small device. When the input signal at terminal 42 returns to a logic one, the logic one at the output of delay circuit 66 and the logic one from terminal 42 maintains a logic zero at the output of NOR gate 62. Boost transistor 60 remains non-conductive during the rising edge of the output signal. Accordingly, transistor 46 need only contend with the relatively small transistor 48 during the rising edge of the output signal and therefore may spend most of its energy charging the capacitive load on terminal 50.

Hence, one of the advantages of the present invention is the use of boost transistor 60 responsive to a pulse signal generated during the falling edge of the input signal at terminal 42 to rapidly discharge the capacitive load on terminal 50 toward ground potential. The falling edge of the output signal is selectable by adjusting the width of the pulse and the relative size of boost transistor 60. Boost transistor 60 is disabled during the low period of the input signal and following rising edge. The associated rise time of the output signal is enhanced because transistor 46 works against a relatively small transistor 48 during the falling edge of the input signal at the gates of transistors 46 and 48 resulting in a higher threshold voltage for inverter circuit 46-60.

Figure 3:
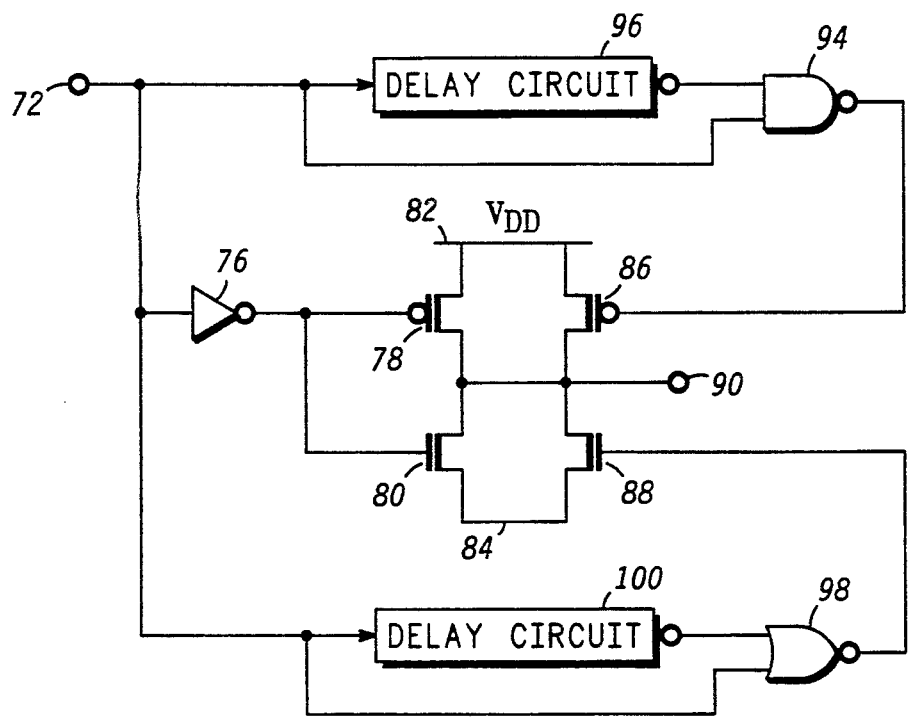
FIG. 3 is a schematic diagram illustrating an inverter logic circuit and pulse generator circuits for providing selectable rise and fall times.

Inverter circuit 70 is shown in FIG. 3 capable of selecting both rise and fall times of its output signal. A logic signal is applied at terminal 72 through inverter 76 to the gates of transistors 78 and 80. The source of transistor 78 is coupled to power supply conductor 82 operating at $V_{DD}$, while the source of transistor 80 is coupled to power supply conductor 84 operating at ground potential. Likewise, boost transistors 86 and 88 have their sources coupled to power supply conductors 82 and 84, respectively, while the common drains of transistors 78, 80, 86 and 88 provide an output signal at terminal 90 inverted with respect to the logic signal from the output of inverter 76. A first pulse generator circuit includes NAND gate 94 having its first input coupled to terminal 72, and delay circuit 96 coupled between terminal 72 and the second input of NAND gate 94. The output of NAND gate 94 is coupled to the gate of boost transistor 86. A second pulse generator circuit includes NOR gate 98 having its first input coupled to terminal 72, and delay circuit 100 coupled between terminal 72 and the second input of NOR gate 98. The output of NOR gate 98 is coupled to the gate of boost transistor 88. Boost transistor 86, NAND gate 94 and delay circuit 96 are similar devices as described for boost transistor 26, NAND gate 36 and delay circuit 32 of FIG. 1. Boost transistor 88, NOR gate 98 and delay circuit 100 are similar devices as described for boost transistor 60, NOR gate 62 and delay circuit 66 of FIG. 2.

A logic one at terminal 72 produces an initial logic zero at the output of inverter 76 which is the actual input of inverting transistors 78 and 80. The initial logic zero at the gates of transistors 78 and 80 allows the former to conduct and maintain terminal 90 at a logic one. Inverter 76 is required to be in the main conduction path of the input signal for proper operation and may be used to partially, or completely, mask the effect of propagation delay through NAND gate 94 and NOR gate 98. The initial logic one at terminal 72 is inverted an odd number of times through delay circuits 96 and 100 producing logic zeroes at the second input of NAND gate 94 and NOR gate 98. The initial logic zero at the second input of NAND gate 94 produces a logic one at the output thereof and disables boost transistor 86. Likewise, the logic one at the first input of NOR gate 98 produces a logic zero and disables boost transistor 88. As the signal at terminal 72 falls through the threshold of inverter 76, the logic one produced at the output thereof turns on transistor 80. The logic zero at the first input of NOR gate 98 develops a logic one at the gate of boost transistor 88 turning it on and pulling terminal 90 low very rapidly. The logic zero at terminal 72 propagates through the three inverter delays of delay circuits 96 and 100, producing logic ones at the second input of NAND gate 94 and NOR gate 98 and correspondingly a logic zero at the output of NOR gate 98 to turn off boost transistor 88. The logic zero from terminal 72 keeps the output of NAND gate 94 at logic one and boost transistor 86 non-conductive. Thus, transistor 88 remains conductive for a period of time equal to the delay through delay circuit 100 for providing the boost drive to discharge the capacitive load on terminal 90 toward ground potential and achieve the desired fall time of the output signal. The actual negative slew rate of the output signal is determined by a combination of the width of the pulse signal and the size of boost transistor 88.

As the signal at terminal 72 rises again through the threshold of inverter 76, the logic zero produced at the output thereof turns on transistor 78. The logic one at the first input of NAND gate 94 combines with the logic one at the output of delay circuit 96 and develops a logic zero at the gate of boost transistor 86 turning it on and pulling terminal 90 high very rapidly. The logic one at terminal 72 propagates through the three inverter delays of delay circuit 96, producing a logic zero at the second input of NAND gate 94 and correspondingly a logic one at the output of the same to turn off boost transistor 86. The logic one from terminal 72 keeps the output of NOR gate 98 at logic zero and boost transistor 88 non-conductive. Thus, transistor 86 remains conductive for a period of time equal to the delay through delay circuit 96 for providing the boost drive to charge the capacitive load on terminal 90 toward $V_{DD}$ and achieve the desired rise time of the output signal. The actual positive slew rate of the output signal is determined by a combination of the width of the pulse signal and the size of boost transistor 86.

Hence, one of the advantages of the present invention is the use of dual boost transistors 86 and 88 responsive to separate pulse signals generated during the opposite edges of the input signal at terminal 72 to rapidly charge and discharge the capacitive load on terminal 90. The rising and falling edge of the output signal are selectable by adjusting the width of the pulses and the relative sizes of boost transistors 86 and 88. Boost transistor 86 is disabled during the falling edge of the input signal, while boost transistor 88 is disabled during the rising edge of the input signal. The rising and falling edges of the output signal are independently controlled by boost transistors 86 and 88, respectively, and associated pulse signals. The circuit shown in FIG. 3 is an example of enhancing the build-up ratio of a string of gates like inverter circuit 70, wherein each gate can be increased in size without sacrificing switching speed.

Figure 4:
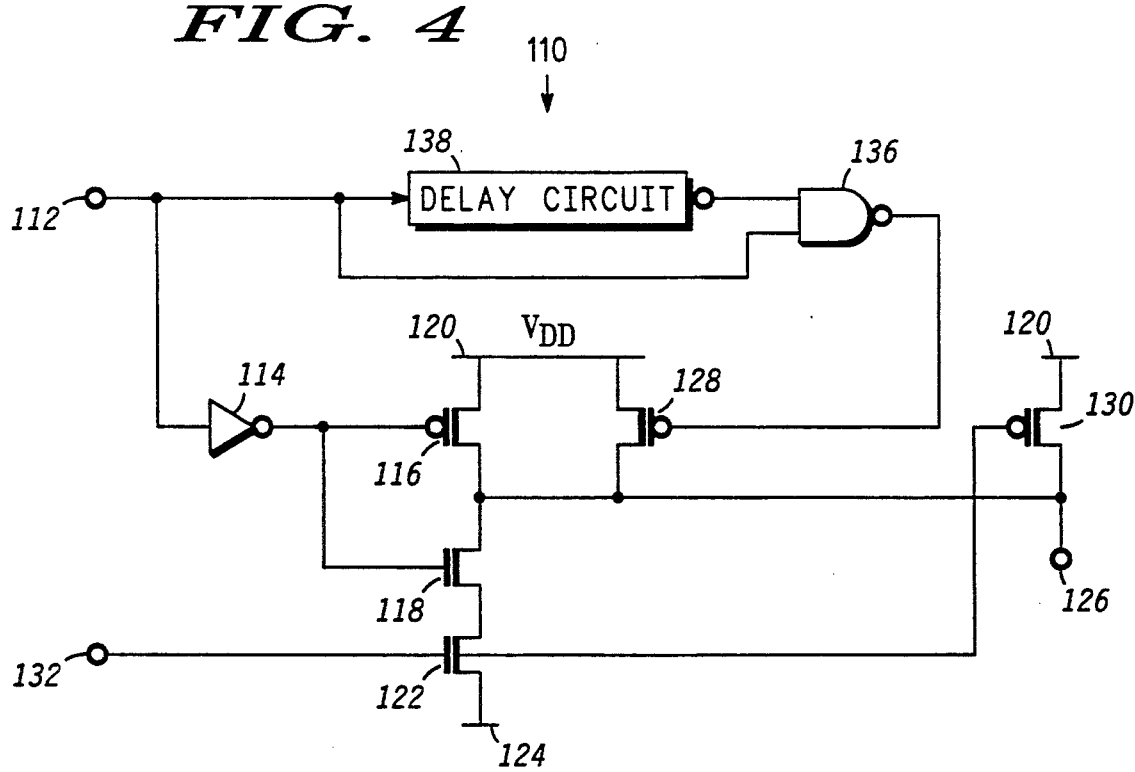
FIG. 4 is a schematic diagram illustrating a NAND logic circuit and pulse generator.

Another embodiment of the present invention is shown in FIG. 4 where the logic circuit under control is NAND gate 110 having a selectable rising edge of its output signal. A first logic signal is applied at terminal 112 through inverter 114 to the gates of transistors 116 and 118. The source of transistor 116 is coupled to power supply conductor 120 operating at positive potential $V_{DD}$, while the source of transistor 118 is coupled through transistor 122 to power supply conductor 124 operating at ground potential. The drains of transistors 116 and 118 are coupled together to terminal 126. Boost transistor 128 and transistor 130 each include a source coupled to power supply conductor 120 and a drain coupled to terminal 126. The gates of transistors 122 and 130 are coupled for receiving a second logic signal from terminal 132. The signal from terminal 112 is also applied at the first input of NAND gate 136 and through delay circuit 138 to the second input of NAND gate 136, while the output of the latter is coupled to the gate of boost transistor 128.

Transistors 116, 118, 122 and 130 form the basic NAND gate. The output signal at terminal 126 remains high while either the output signal of inverter 114 or terminal 132 is logic zero. The output signal falls low when both input signals are logic one as per the conventional NAND operation. NAND gate 110 is configured for controlling the rising edge of the output signal at terminal 126 from a positive transition of the signal applied at terminal 112. It is understood that a pulse generator circuit like 136-138 and boost transistor like 128 may be connected to transistor 130 in a similar manner to achieve control over the rising edge of the output signal with a zero-going transition of the signal applied at terminal 132. To simplify the present example, a logic one is applied at terminal 132 to disable transistor 130. A logic zero at terminal 112 produces an initial logic one at the gates of transistor 116 and 118 allows the latter to conduct and maintain terminal 126 at a logic zero. The initial logic zero at terminal 112 is inverted an odd number of times through delay circuit 138 producing a logic one at the second input of NAND gate 136. The logic zero at the first input of NAND gate 136 produces a logic one at the output thereof and disables boost transistor 128. As the signal at terminal 112 rises through the threshold of inverter 114, the logic zero produced at the output thereof turns on transistor 116. The logic one at the first input of NAND gate 136 develops a logic zero at the gate of boost transistor 128 turning it on. Since boost transistor 128 is a much larger device than transistor 116, terminal 126 is pulled high toward $V_{DD}$ very rapidly. The logic one at terminal 112 propagates through the three inverter delays of delay circuit 138 producing a logic zero at the second input of NAND gate 136 and correspondingly a logic one at the output of the same to turn off boost transistor 128. Thus, transistor 128 remains conductive for a period of time equal to the delay through delay circuit 138 for providing the boost drive to charge the capacitive load on terminal 126 toward $V_{DD}$ and achieve the desired rise time of the output signal.

Figure 5:
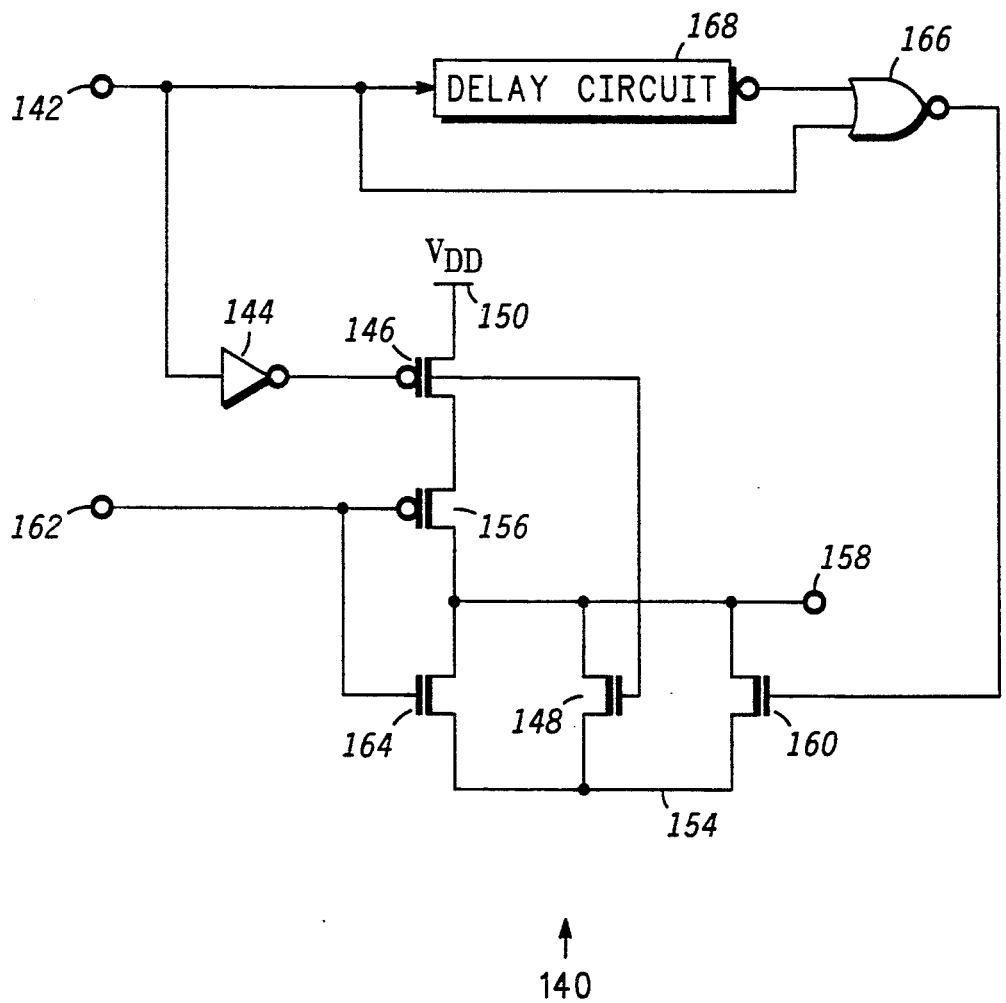
FIG. 5 is a schematic diagram illustrating a NOR logic circuit and pulse generator.

Yet another embodiment of the present invention is shown in FIG. 5 where the logic circuit under control is NOR gate 140 having a selectable falling edge of its output signal. A first logic signal is applied at terminal 142 through inverter 144 to the gates of transistors 146 and 148. The source of transistor 146 is coupled to power supply conductor 150 operating at $V_{DD}$, while the source of transistor 148 is coupled to power supply conductor 154 operating at ground potential. The drain of transistor 146 is coupled through transistor 156 to terminal 158, while the drain of transistor 148 is also coupled to terminal 158. Boost transistor 160 includes a drain coupled to terminal 158 and a source coupled to power supply conductor 154. A second logic signal is applied at terminal 162 to the gates of transistors 156 and 164. The drain of transistor 164 is coupled to terminal 158 while the source of the same is coupled to power supply conductor 154. The signal from terminal 142 is also applied at the first input of NOR gate 166 and through delay circuit 168 to the second input of NAND gate 166, while the output of the latter is coupled to the gate of boost transistor 160.

Transistors 146, 148, 156 and 164 form the basic NOR gate. The output signal at terminal 158 remains logic zero while either the output signal of inverter 144 or terminal 162 is logic one. The output signal becomes logic one when both input signals are logic zero as per the conventional NOR operation. NOR gate 140 is configured for controlling the falling edge of the output signal at terminal 158 from a negative transition of the signal applied at terminal 142. It is understood that a pulse generator circuit like 166–168 and boost transistor like 160 may be connected to transistor 164 in a similar manner to achieve control over the falling edge of the output signal with a positive transition of the signal applied at terminal 162. To simplify the present example, a logic zero is applied at terminal 162 disabling transistor 164. A logic one at terminal 142 produces an initial logic zero at the gates of transistor 146 and 148, allowing the former to conduct and maintain terminal 158 at a logic one. The initial logic one at terminal 142 is inverted an odd number of times through delay circuit 168 producing a logic zero at the second input of NOR gate 166. The initial logic one at the first input of NOR gate 166 produces a logic zero at the output thereof and disables boost transistor 160. As the signal at terminal 142 falls through the threshold of inverter 144, the logic one produced at the output thereof turns on transistor 148. The logic zero at the first input of NOR gate 166 in combination with the logic zero still present at the output of delay circuit 168 develops a logic one at the gate of boost transistor 160 turning it on. Since boost transistor 160 is a much larger device than transistor 148, terminal 158 is pulled low toward power supply conductor 154 very rapidly. The logic one at terminal 142 propagates through the three inverter delays of delay circuit 168 producing a logic one at the second input of NOR gate 166 and correspondingly a logic zero at the output of the same to turn off boost transistor 160. Thus, transistor 160 remains conductive for a period of time equal to the delay through delay circuit 168 for providing the boost drive to discharge the capacitive load on terminal 158 toward ground potential and achieve the desired fall time of the output signal.

Hence, what has been provided is a novel combination of a boost transistor and a pulse generator circuit which allows control over the rise and/or fall times of many types of logic circuits including inverters, NAND gates and NOR gates. The boost transistor conducts for a period of time during a predetermined edge of the input signal to rapidly charge or discharge the output node and remains non-conductive otherwise to avoid adversely effecting the slew rate of the opposite edge.

I claim:

1. A circuit having an input for receiving an input signal and having an output for providing an output signal, comprising:
    a logic circuit responsive to the input signal applied to the circuit for providing a first current through the output of the circuit and further responsive to a first pulse signal for providing a boost current through the output of the circuit following a first transition of the input signal, said boost current driving a transition of the output signal while said first current maintains a resultant logic state of the output signal, said logic circuit including,
    (a) a first transistor having a gate, a drain and a source, said source being coupled to a first power supply conductor, said drain being coupled to the output of the circuit, said gate being coupled for receiving the input signal applied to the circuit, and
    (b) a second transistor having a gate, a drain and a source, said source being coupled to said first power supply conductor, said drain being coupled to the output of the circuit, said gate being coupled for receiving said first pulse signal;
    delay circuit having an input coupled for receiving the input signal and having an output for providing a delayed input signal with a predetermined delay with respect to the input signal; and
    circuit means responsive to the input signal and said delayed input signal for generating said first pulse signal with a pulse width equal to said predetermined delay following said first transition of the input signal, said circuit means including,
    (c) an inverter having an input coupled to the input of the circuit and having an output, and
    (d) a NAND gate having first and second inputs and an output, said first input being coupled to said output of said inverter, said second input receiving said delayed input signal from said output of said delay circuit, said output providing said first pulse signal.

2. The circuit of claim 1 further comprising a third transistor having a gate, a drain and a source, said gate being coupled for receiving the input signal, said source being coupled to a second power supply conductor, said drain being coupled to the output of the circuit.

3. A circuit having an input for receiving an input signal and having an output for providing an output signal, comprising:
    a logic circuit responsive to the input signal applied to the circuit for providing a first current through the output of the circuit and further responsive to a first pulse signal for providing a boost current through the output of the circuit following a first transition of the input signal, said boost current driving a transition of the output signal while said first current maintains a resultant logic state of the output signal;
    delay means coupled for receiving the input signal and providing a delayed input signal having a predetermined delay with respect to the input signal; and
    circuit means responsive to the input signal and said delayed input signal for generating said first pulse signal with a pulse width equal to said predetermined delay following said first transition of the input signal, said circuit means including a NOR gate having first and second inputs and an output, said first input being coupled to the input of the circuit, said second input receiving said delayed input signal, said output providing said first pulse signal.

4. The circuit of claim 3 wherein said delay means includes a delay circuit coupled between the input of the circuit and said second input of said NOR gate.

5. The circuit of claim 4 wherein said logic circuit includes:
   an inverter having an input coupled to the input of the circuit and having an output;
   a first transistor having a gate, a drain and a source, said source being coupled to a first power supply conductor, said drain being coupled to the output of the circuit, said gate being coupled to said output of said inverter; and
   a second transistor having a gate, a drain and a source, said source being coupled to said first power supply conductor, said drain being coupled to the output of the circuit, said gate being coupled for receiving said first pulse signal.

6. The circuit of claim 5 further comprising a third transistor having a gate, a drain and a source, said gate being coupled to said output of said inverter, said source being coupled to a second power supply conductor, said drain being coupled to the output of the circuit.

7. A circuit having an input for receiving an input signal and having an output for providing an output signal, comprising:
   a logic circuit responsive to the input signal applied to the circuit for providing a first current through the output of the circuit and further responsive to a first pulse signal for providing a boost current through the output of the circuit following a first transition of the input signal, said boost current driving a transition of the output signal while said first current maintains a resultant logic state of the output signal;
   delay circuit having an input coupled for receiving the input signal and having an output for providing a delayed input signal with a predetermined delay with respect to the input signal; and
   circuit means responsive to the input signal and said delayed input signal for generating said first pulse signal with a pulse width equal to said predetermined delay following said first transition of the input signal, said circuit means including,
   (a) a NOR gate having first and second inputs and an output, said first input being coupled to the input of the circuit, said second input receiving a second delayed input signal, said output providing a second pulse signal, and
   (b) a NAND gate having first and second inputs and an output, said first input being coupled to the input of the circuit, said second input receiving said delayed input signal from said output of said delay circuit, said output providing said first pulse signal.

8. The circuit of claim 7 further including a second delay circuit coupled between the input of the circuit and said second input of said NOR gate for providing said second delayed input signal.

9. The circuit of claim 8 wherein said logic circuit includes:
   an inverter having an input coupled to the input of the circuit and having an output;
   a first transistor having a gate, a drain and a source, said source being coupled to a first power supply conductor, said drain being coupled to the output of the circuit, said gate being coupled to said output of said inverter; and
   a second transistor having a gate, a drain and a source, said source being coupled to said first power supply conductor, said drain being coupled to the output of the circuit, said gate being coupled for receiving said first pulse signal.

10. The circuit of claim 9, wherein said logic circuit further includes:
    a third transistor having a gate, a drain and a source, said gate being coupled to said output of said inverter, said source being coupled to a second power supply conductor, said drain being coupled to the output of the circuit; and
    a fourth transistor having a gate, a drain and a source, said source being coupled to said second power supply conductor, said drain being coupled to the output of the circuit, said gate being coupled for receiving said second pulse signal from said circuit means.

11. A method of selecting the rate of transition of an output signal of a logic circuit, comprising the steps of:
    enabling a minimal current through an output of the logic circuit in response to a first transition of an input signal applied to the logic circuit;
    enabling a boost current through said output of the logic circuit following said first transition of said input signal; and
    disabling said boost current after a predetermined period of time and allowing said minimal current to maintain the state of the output signal of the logic circuit by
    (a) delaying a logic one of the input signal through a odd number of inverter circuits for producing a delayed logic zero, and
    (b) combining said delayed logic zero with said logic one of the input signal for producing a logic one which disables said boost current.

12. The method of claim 11 wherein said step of enabling a boost current includes the steps of:
    applying a logic one of the input signal to a first input of a NAND gate; and
    combining with a logic one at a second input of said NAND gate for producing a logic zero which enables said boost current.

13. A circuit having an input for receiving an input signal and having an output for providing an output signal, comprising:
    a logic circuit including first and second transistors each having a gate, a drain and a source, said sources of said first and second transistors being coupled together to a first power supply conductor, said drains of said first and second transistors being coupled together to the output of the circuit, said gate of said first transistor being coupled for receiving the input signal applied to the circuit, said second transistor providing a boost current through the output of the circuit; and
    circuit means responsive to the input signal applied to the circuit for providing a first pulse signal to said gate of said second transistor following a first transition of the input signal to drive a transition of the output signal with said boost current, said circuit means including,
(a) a NAND gate having first and second inputs and an output, said first input being coupled to the input of the circuit, said output being coupled to said gate of said second transistor, and
(b) a delay circuit coupled between the input of the circuit and said second input of said NAND gate for providing first pulse signal at said output of said NAND gate.

14. The circuit of claim 13 wherein said logic circuit further includes:
an inverter having an input coupled to the input of the circuit and having an output;
a third transistor having a gate, a drain and a source, said drain being coupled to the output of the circuit, said gate being coupled to said output of said inverter;
a fourth transistor having a gate, a drain and a source, said source being coupled to a second power supply conductor, said drain being coupled to said source of said third transistor, said gate being coupled for receiving a second input signal of the circuit; and
a fifth transistor having a gate, a drain and a source, said source being coupled to said first power supply conductor, said drain being coupled to the output of the circuit, said gate being coupled for receiving said second input signal of the circuit.

* * * * *